(12) United States Patent
Boettler et al.

(10) Patent No.: US 6,407,569 B1
(45) Date of Patent: *Jun. 18, 2002

(54) INTEGRATED CIRCUIT WITH IN SITU CIRCUIT ARRANGEMENT FOR TESTING INTEGRITY OF DIFFERENTIAL RECEIVER INPUTS

(75) Inventors: Jeffrey Paul Boettler; Robert Glen Gerowitz; William Arthur Noon, all of Raleigh; Howard James Schubert, Jr., Pinehurst; Chad Everett Winemiller, Cary, all of NC (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/275,295

(22) Filed: Mar. 24, 1999

(51) Int. Cl.[7] .............................................. G01R 31/28
(52) U.S. Cl. ..................................................... 324/763
(58) Field of Search .......................... 324/158.1, 73.1, 324/765, 763; 438/14, 17, 18; 714/728; 257/40, 48

(56) References Cited

U.S. PATENT DOCUMENTS

| | | | |
|---|---|---|---|
| 4,178,582 A | 12/1979 | Richman | 340/146.1 E |
| 4,687,988 A | * 8/1987 | Eichelberger et al. | 714/728 |
| 4,743,841 A | 5/1988 | Takeuchi | 324/73 R |
| 4,782,300 A | 11/1988 | Bonaccio et al. | 324/509 |
| 4,792,950 A | * 12/1988 | Volk et al. | 340/825.03 |
| 5,287,386 A | 2/1994 | Wade et al. | 375/36 |
| 5,712,576 A | 1/1998 | Nagataki | 324/763 |
| 5,787,098 A | 7/1998 | DasGupta et al. | 371/22.3 |
| 5,991,521 A | * 11/1999 | Gabele et al. | 324/512 |

OTHER PUBLICATIONS

IBM Technical Disclosure Bulletin, vol. 26, No. 1, Jun. 1983 "Error Detection on Balanced Twisted Pair Links".
IBM Technical Disclosure Bulletin, vol. 36, No. 1, Jan. 1993 "Detection of Cable Opens for Differential Interfaces".
ASIC Products Databook, CMOS 5S, Document No. SA14–2203–02, pp. 724–725 "3.3V STI PGI Non–Test Differential Receiver w/Pull Down" Nov. 1995.

* cited by examiner

Primary Examiner—Vinh P. Nguyen
(74) Attorney, Agent, or Firm—Joscelyn G. Cockburn

(57) ABSTRACT

Stuck-at fault, shorted and open circuit conditions occurring in the differential inputs to Differential Receivers on a Large Scale Integrated (LSI) chip are detected by a test circuit arrangement fabricated on the chip. The test circuit arrangement includes Pass Gate devices operatively coupled to the differential inputs and an Exclusive NOR circuit (XNOR) coupled to the Pass Gate devices. Pull devices are coupled to the Pass Gate devices and the differential inputs. By activating the Pass Gate devices and applying a test sequence to the differential inputs, the state of the output of the XNOR circuit indicates if an open circuit, stuck-at or short exists in the inputs to the Differential Receiver.

12 Claims, 5 Drawing Sheets

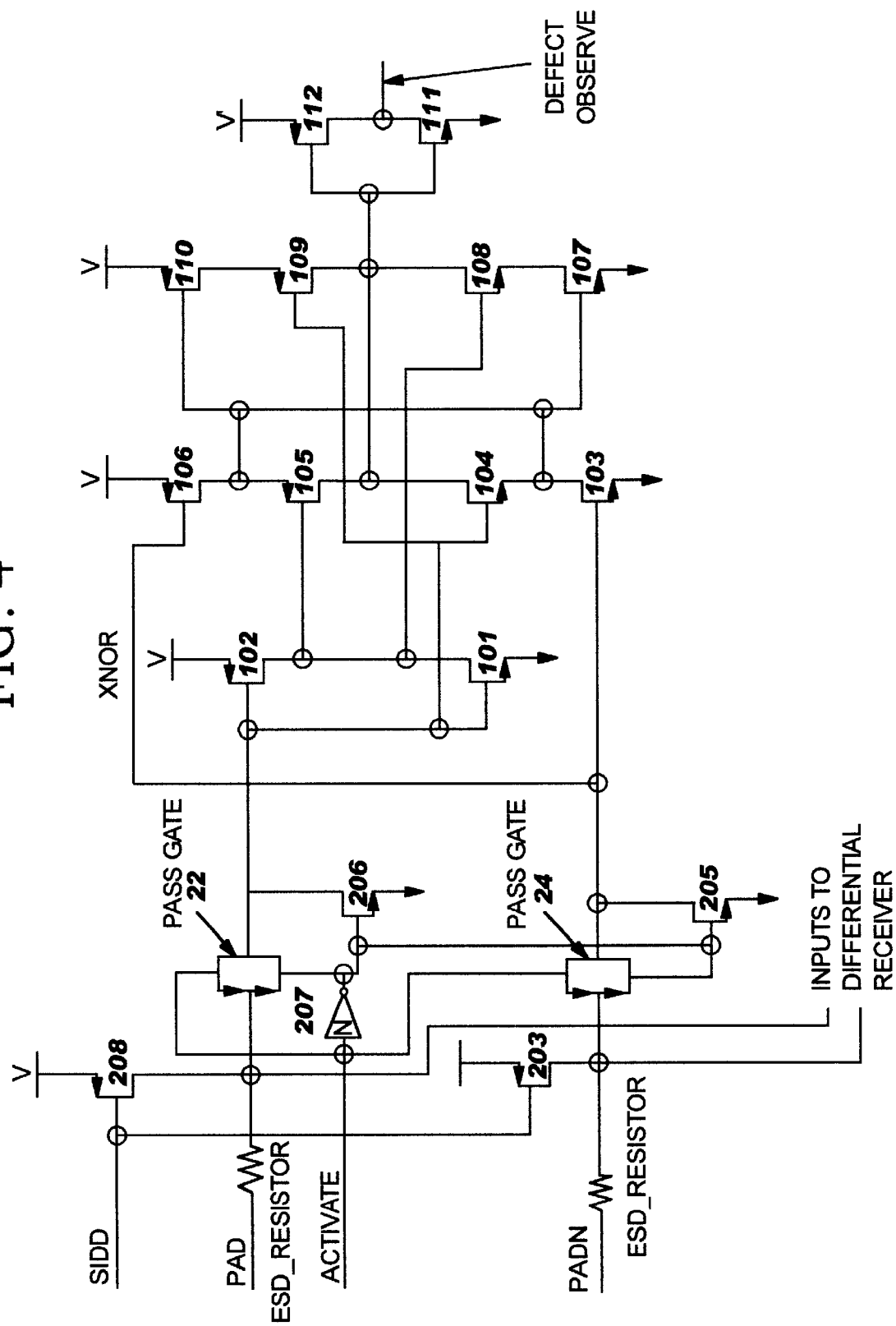

INTEGRATED CIRCUIT WITH IN SITU CIRCUIT ARRANGEMENT FOR TESTING INTEGRITY OF DIFFERENTIAL RECEIVER INPUTS

BACKGROUND OF THE INVENTION

1. Field of the Invention

The present invention relates to the field of integrated circuits in general and, in particular, to circuits that test the integrity of said integrated circuits.

2. Prior Art

The use of integrated circuit technology for packaging circuit chips is well known in the prior art. A conventional integrated circuit chip includes a substrate on which a plurality of on-chip logic and other circuits are provided. The circuits cooperate to provide functions specific to the chip. The on-chip circuits include Receivers that receive signals from off the chip and Transmitters and/or Drivers for forwarding signals off the chip.

Analog Differential Receivers are one type of receivers used on integrated circuit chips. The invention described hereinafter is particularly concerned with chips using Analog Differential Receivers. Analog Differential Receivers rely upon "differential pair" signaling in order to operate. Differential pair signaling requires two physical signals of different voltage levels to be transmitted to the Differential Receiver in order to facilitate the transfer of a single bit of information. The logical state of the information bit at the output of the Differential Receiver is usually represented by the difference in voltage levels between the input signals.

As a consequence, Differential Receivers rely on their inputs to be different by a few 100 millivolts and centered around some midrange voltage to produce the correct output. If one of the inputs to the Differential Receivers is stuck at one of the voltage supplies (GND, VDD, VDD2, etc.) through a short, or is at a metastable state due to an open circuit, or is shorted to another signal, the outputs will be indeterminate.

U.S. Pat. Nos. 4,782,300 and 5,287,386 use discrete components, including resistors, for detecting open in transmission lines. Even though these systems may operate satisfactorily for their intended purposes, they are only effective at a board system level rather than the module or wafer level. In addition, these patents do not address stuck-at fault conditions which can cause problems in integrated circuits.

The IBM® CMOS 5S Data Book describes a system that detects if both Pad and Padn lines are open. The system described in the IBM CMOS 5S Data Book deviates from the invention set forth below in three main areas. First, the use of an XNOR or XNOR allows the designer to discriminate dynamically between valid and invalid conditions during functional use. Therefore, this circuit could be used functionally to avoid processing transient invalid conditions on the Pad/Padn lines (i.e., the same value on both lines) that could cause improper operations in a circuit. Second, our circuit is degateable, removing the capacitive loading and high speed noise from a functional circuit. Finally, our circuit is more testable than the circuit described in the prior art when using a limited-resource manufacturing tester, whereby only a portion of the possible circuit input and output pins are connected to the manufacturing tester. This is accomplished, through the use of two I/O wrap drivers; whereas, the prior art uses only one.

As a consequence, there is a need to provide a test circuit which addresses stuck-at fault conditions and open circuit conditions. In addition, the test circuit should be able to detect fault conditions at different stages (wafer level, module level or full I/O contact levels) of chip manufacturing process. This would allow the early elimination of defective chips prior to their being shipped to the field or used in products. By doing so, the overall cost of the machine would also be lowered, since the yield of chips from a particular line could be accurately determined and cost for removing defective chips from machines already in the field would be eliminated.

SUMMARY OF THE INVENTION

An in situ test circuit, fabricated on the integrated circuit chip, detects defects in the inputs to a Differential Receiver on the chip. The test circuit includes a pair of Pull devices; one of each coupled to one of the differential pair inputs. A pair of Pass Gate devices, one of each is coupled to one of the Pull devices and one of the differential pairs inputs. An exclusive NOR (XNOR) circuit arrangement is coupled to each of the Pass Gate devices. A first control signal is connected to the Pass Gates which isolates the test circuitry from the Differential Receiver. A second control signal is connected to the Pull devices. By applying a test pattern to the differential pairs and monitoring the output of the XNOR circuit arrangement, defects in the differential pairs can be determined.

In an alternate embodiment, a fault detection circuit is provided for each Differential Pair inputs to the integrated circuit.

BRIEF DESCRIPTION OF THE DRAWINGS

FIG. 4 shows a detailed circuit diagram for the fault detection circuit.

DETAILED DESCRIPTION OF THE PREFERRED EMBODIMENTS

Figure 1:
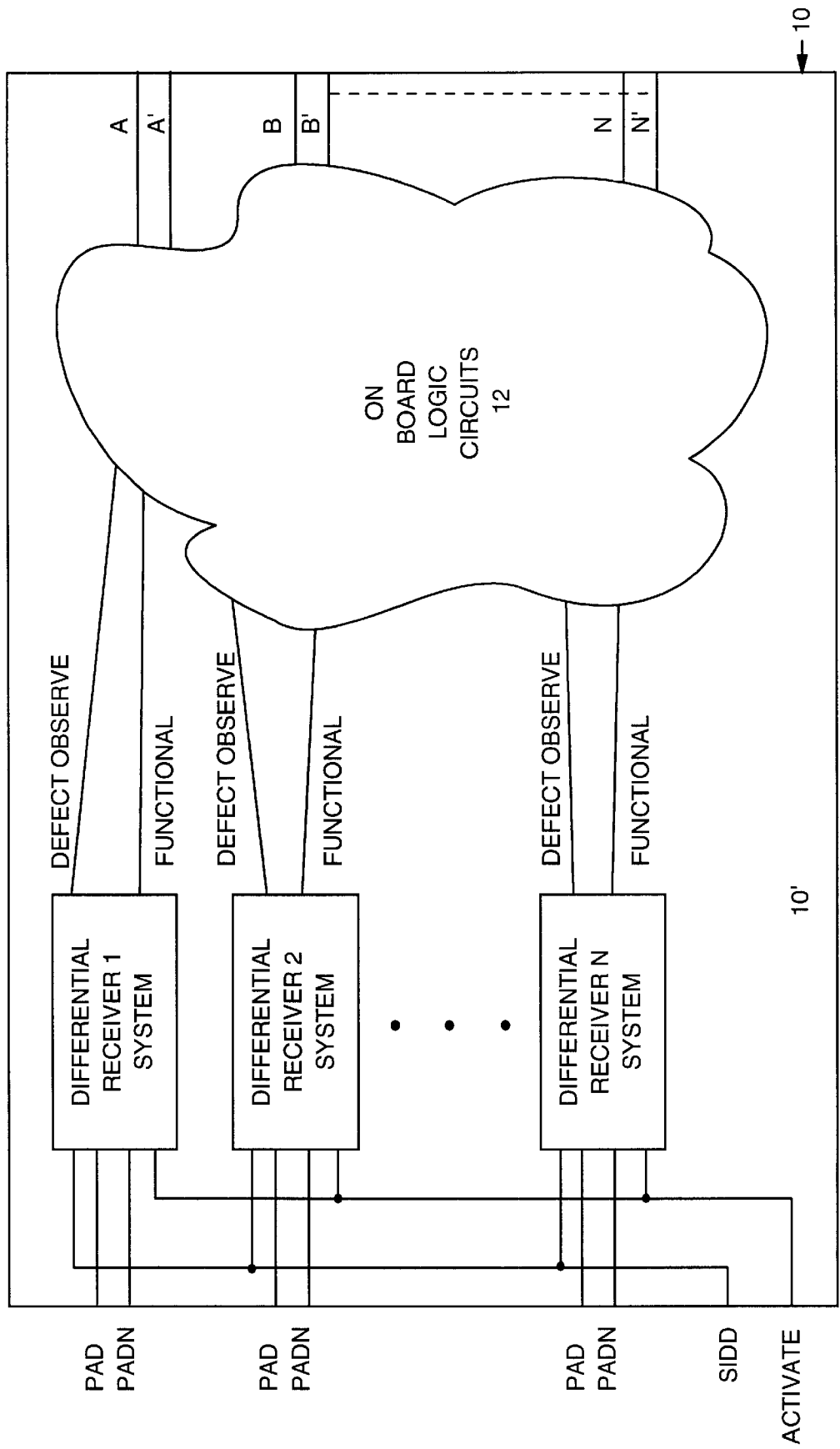
FIG. 1 shows an integrated circuit system according to the teachings of the present invention.

FIG. 1 shows a schematic of the integrated circuit embodying the teachings of the present invention. The integrated circuit (IC) may be packaged as a chip, ASIC or any of the well known forms of IC packages. The IC 10 includes On Board Logic Circuits 12 and a plurality of Differential Receiver Systems (SYS) labeled 1 through n. The On Board Logic Circuits 12 include various types of integrated circuits designed to provide particular functions. The type of functions which one could design are so diverse that no attempt will be made to identify a particular type of function or logic circuit.

Each one of the Differential Receiver Systems (described below) is provided with a pair of differential input signals labeled Pad and Padn. Under normal operating conditions, the Pad and its associated Padn signals are out of phase. Two control signals labeled SIDD and Activate are also provided. The control signal labeled SIDD is used to ensure there is no current flow during current measurement manufacturing tests, commonly known as IDDQ or static current test. The control signal Activate is used to eliminate additional loading on the functional signals Pad and Padn when the chip is operating in normal (non-test) condition. Each of the Differential Receivers has two outputs. The outputs labeled A, B, . . . n are the fault detection outputs labeled Defect Observe. As will be explained subsequently, when a test pattern is applied to each Pad and Padn input and the activate signal is energized, the signal read at the output labeled Defect Observe indicates whether or not there is a defect in one or both of the inputs (Pad and Padn). Likewise, output labeled A!B,! and n! are the functional outputs and provide the signal representative of the signal received on the Pad and Padn inputs. The components including the On Board Logic, Differential Receiver System, etc., described above are fabricated on substrate 10'. Any of the well known LSI techniques and manufacturing processes used in the industry can be used to fabricate the component on the substrate.

Figure 2:
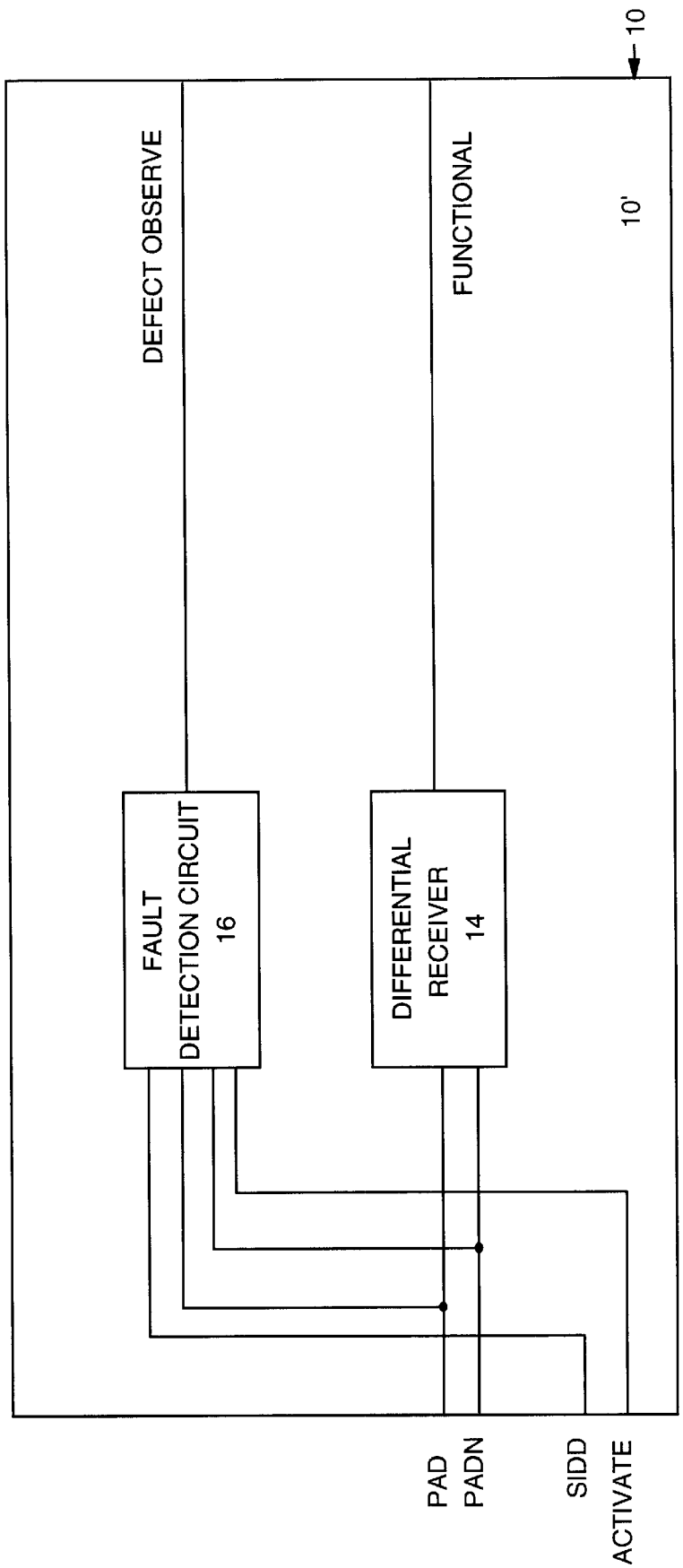
FIG. 2 shows an expanded view of the fault detection circuit and the Differential Receiver in block diagram form.

FIG. 2 shows an expanded view of the Differential Receiver System shown in FIG. 1. Each of the Differential Receiver System in FIG. 1, includes a Differential Receiver 14 and a Fault Detection Circuit 16. The Fault Detection Circuit 16 detects fault conditions in the Pad and Padn input conductors; whereas, Differential Receiver 14 passes the signals received on the Pad and Padn input conductors to the output labeled Functional. As stated previously, when the control signal Activate is enabled, the Fault Detection Circuit 16 (details to be given hereinafter) monitors Pad and Padn input lines and outputs fault signals on the Defect Observe output if a fault condition is sensed. The Differential Receiver 14 is a standard off-the-shelf item which is well known in the art and further description of this device will not be given in this document.

Figure 3:
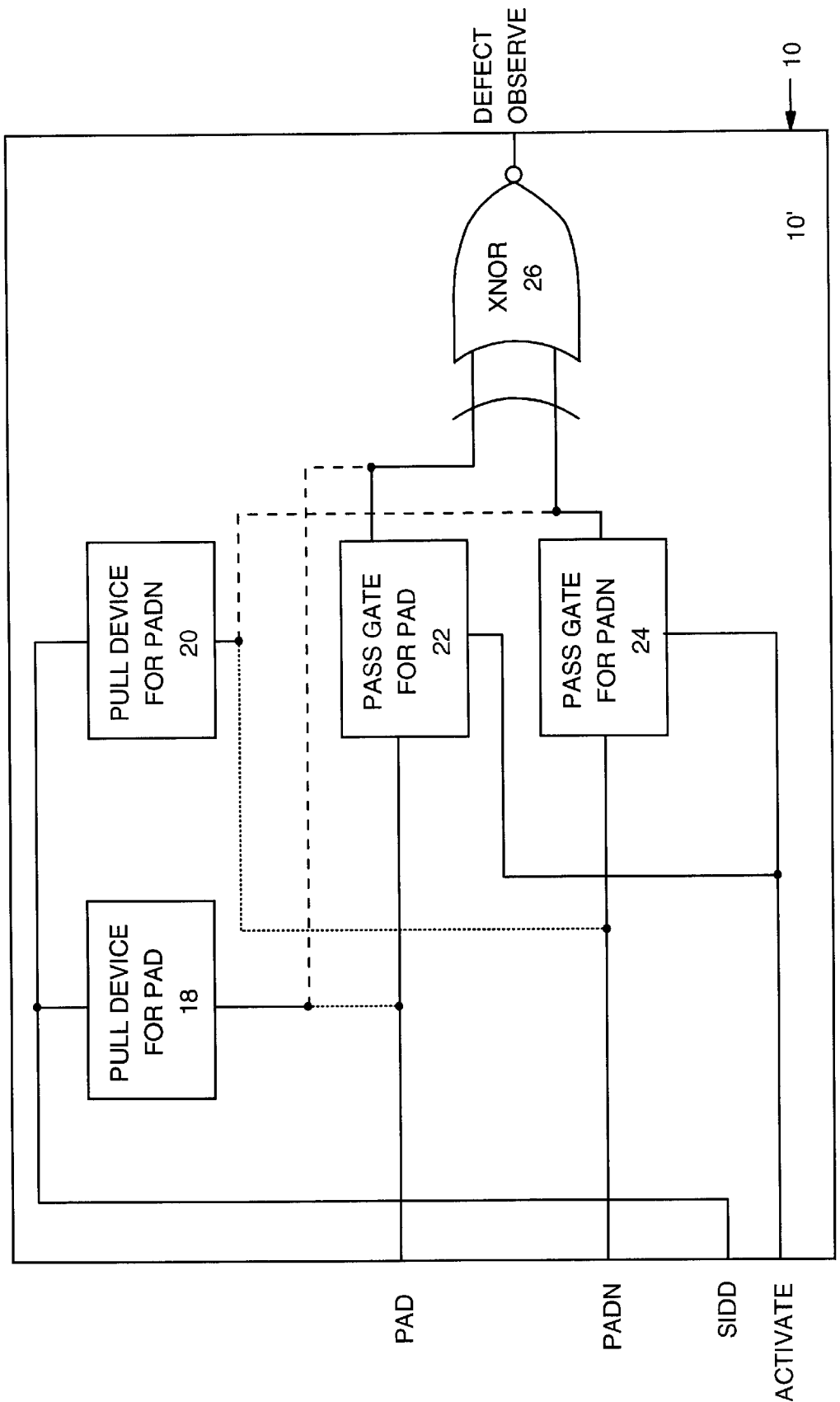
FIG. 3 shows an exploded view of the fault detection circuit in block diagram form.

FIG. 3 shows an exploded view of the fault detection circuit according to the teachings of the present invention. Items in FIG. 3 that have been discussed and described previously are given common names or numerals and will not be described further. The Fault Detection Circuit 16 (FIG. 2) includes Pull Device 18, Pull Device 20, Pass Gate 22, Pass Gate 24 and exclusive NOR (XNOR) Circuit 26. Each of the inputs Pad and Padn are connected to dedicated pull device and Pass Gate device, respectively. In particular, Pad input is coupled to Pull Device 18 and Pass Gate 22. Likewise, Padn is coupled to Pull Device 20 and Pass Gate 24. The purpose of the dashed and dotted lines in FIG. 3 are intended to show two possible interconnection techniques to account for the situation of unconnected inputs on the Differential Receiver. Either the dotted line or the dashed line would be connected to the pull device such that if an input to the Differential Receiver were unconnected, the pull device would cause this input to gravitate to the value of the pull device. It should also be noted that the pull device could be a pull-up device or a pull-down device. The choice of one over the other depends on the designer. It should be noted in FIG. 3, that if the dotted lines are connected, the dashed lines from the pull devices would be disconnected. Similarly, if the dashed lines from the pull devices are connected, the dotted lines from the Pad and Padn conductors into the pull devices would be disconnected.

Still referring to FIG. 3, in normal circuit operation, the control line labeled Activate would disable the path from Pad and Padn through the Pass Gates and out of the circuit. However, during manufacturing testing, Activate would be enabled to allow the values on Pad and Padn to be observed through XNOR circuit 26. Placing the four possible values for a two input XNOR on Pad and Padn which can be done with two I/O wrap drivers and observing them on the output of the XNOR circuit 26 ensures there are no manufacturing stuck-at fault defects, open circuits, or shorted wires in this logic.

FIG. 4 shows a detailed circuit diagram for the fault detection circuit. The differential input signals are labeled Pad and Padn. Likewise, the control signals are labeled SIDD and Activate. The function provided by the control signals are discussed above and win not be repeated here. The fault detection circuit includes Pull Device 208 and Pull Device 203. In the preferred embodiment of the invention, the pull devices are P-Channel pull-up device. Of course, other types of pull devices could be used without deviating from the spirit or scope of the present invention. The base electrode of the pull devices are connected to the SIDD control line. The emitter electrode of each of the devices are tied to a voltage supply level. The collector electrode of the pull devices are connected to the Pad and Padn inputs through respective electrostatic discharge (ESD) resistors. Pass Gate 22 has a connection to Pull Device 208, a connection to N-Channel Device 206 and inverter 207, The other output from Pass Gate 22 Is connected to an input of the XNOR circuit. The control line labeled Activate is connected to the input of Inverter 207 and another terminal of Pass Gate 22. In the preferred embodiment of this invention, Pass Gate 22 comprises an N-Channel and P-Channel device. Similariy, Pass Gate 24 is comprised of an N-Channel and P-Channel device. The Pass Gate 24 has four contacts, one of which is connected to the Padn signal line through ESD resister; another one is connected to Inverter 207; another one is connected to the input of the XNOR; and the fourth one is connected to N-Channel device 205. it should be noted that the control line labeled Activate and Inverter 207 allow input into the XNOR circuit to be connected to the N-Channel devices 206 and 205 or to the Pass Gate 22 or 24.

Still referring to FIG. 4, the XNOR circuit which does the fault detection includes Transistors 101 through 112 configured and connected as shown in FIG. 4.

The first three stages of the XNOR circuit are connected to the same voltage level labeled V. The last stage of the XNOR is tied to a different voltage level labeled V!. By tying the stages in the XNOR circuit to different voltage levels, the design is able to accommodate Pad and Padn signals that are supplied at a first voltage level, whereas the operating voltage level of circuits on the chip is operating at a different voltage level. For example, the voltage level of the Pad and Padn signal could be 0 to 1.5 v; whereas, the operating voltage level of components on the chip is 0 to 3.5 v. In such a System, the voltage for V would be set at 1.5 v, while the voltage at V! is set at 3.5 v. Another way of compensating for the dissimilarity in the voltages would be to add buffers in front of the XNOR circuit that are able to translate between the different voltage levels.

Figure 5A:
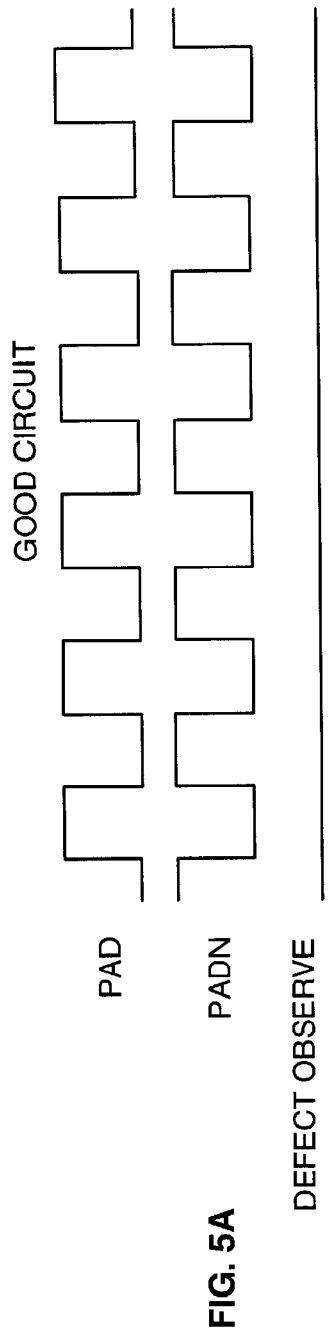
FIGS. 5A, 5B and 5C show signal waveforms at the output of the detection circuit.
Figure 5B:
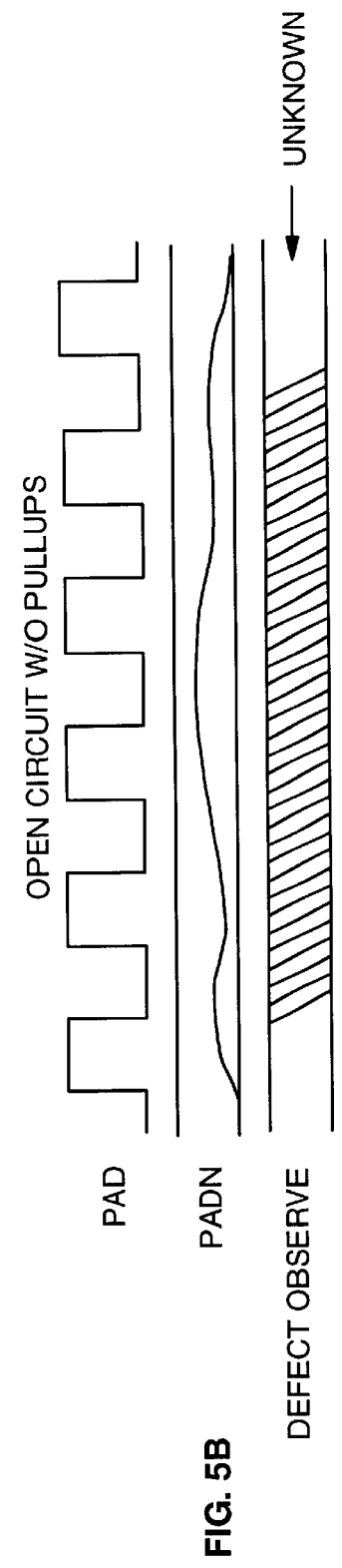
Figure 5C:
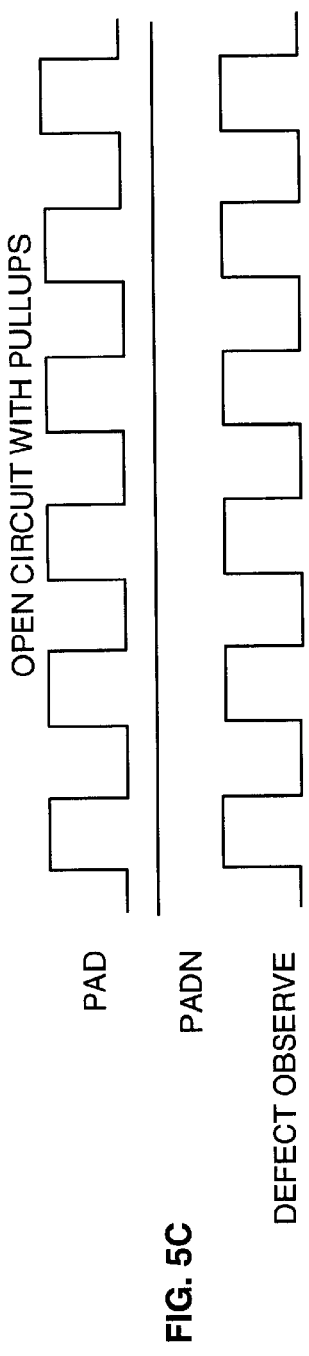

FIGS. 5A, 5B and 5C show signal waveforms generated at the output of the XNOR circuit. The form of the signal depends on the state of the input conductors relative to the input signals. The XNOR circuit is designed to have a threshold at midpoint of the incoming signal levels. In this particular situation, the midpoint level is 0.75 volts. The XNOR is used because the input, when no shorts, stuck-at or open circuits occur, should always be at opposite polarities and thus produce a low at the output of the XNOR as shown in FIG. 5A. If an open, stuck-at or short circuit exists, a high would register on the XNOR output, at certain points during the test, as shown in FIG. 5C. During regular testing of the differential signals, VIH and VIL voltage levels are set as inputs. In one example, VIH=0.95 v and VIL=0.55 v. If one of the inputs is open, the net will be pulled high due to the Pull Up device. When the other side of the differential circuit receives a VIH, a High will appear in the output of the XNOR as shown in FIG. 5C.

With reference to FIG. 5B, if a net is open, without Pull devices, a metastable state may exist at the input of the XNOR, thus producing an unknown for the output. The pull devices guarantee that an open will be pulled to Vdd and trigger the XNOR correctly. In FIG. 5B, the effect of an open circuit without pull devices are shown. With the pull devices the output is forced to a known state.

The input signal for the test circuit are the two inputs Pad and Padn that go in the Differential Receiver. The control signal labeled Activate enables the Pass Gates and the XNOR. In addition, the SIDD control signal turns off the pull devices when doing SIDD testing.

The XNOR circuit is used to perform the basic logic function of XNOR which is if the two inputs are different, then a logic low is at the Defect Observe output. Similarly, if the two inputs are the same, a logic high is at the Defect Observe output. One has to be careful in designing the XNOR or else it could create a problem in the test. The problem in the design of the XNOR will occur if the input voltage on the differential pair is different from the operating voltage on the chip. The XNOR has been designed to compensate for the situation. More specifically, if the low input voltage is at some voltage A and high input voltage is some voltage B, then the switching point of the XNOR circuit should be (A+B)/2. This can be done in at least two ways. In one way, a power supply is used for the XNOR that the input signals (Pad and Padn) are referenced to. Then adjusting the output stage of the XNOR to properly output a logic low and high for the internal logic. Another way is to add buffers in front of the XNOR circuit that are able to translate between the different voltage levels. Preceding the XNOR circuit are the Pass Gates. These are used solely to isolate the high speed Differential Receiver from the test circuit for noise and capacity reasons. When the control signal Activate is high, the Pass Gate allows a Receiver input from the Pad and Padn to go to the XNOR to be tested. When the Activate signal is low, the Pass Gates are off and the NFET 205 and 206 (FIG. 4) are turned on to provide a stable (biased) signal to the XNOR circuit.

Even though the preferred embodiment uses an XNOR circuit arrangement, it is well within the skill of one skilled in the art to use other types of circuit arrangement without deviating from the scope or spirit of the present invention. For example, the circuit arrangements could include AND, NAND, OR, NOR, XOR, etc.

Finally, there are the Pull Devices 203 and 208. In a specific embodiment, they are shown as Pull Up transistors and are connected between the ESD resistors and the Pass Gates. The Pull Devices may also be pull down devices. The main idea is the input from the Pad and Padn must be pulled to valid high or low which the XNOR can understand. These pull devices may also be placed between the Pass Gate and the XNOR.

While the invention has been described in terms of preferred embodiments, those skilled in the art will recognize that the invention can be practiced with modification within the spirit and scope of the appended claims.

Having thus described our invention, what we claim is as follows:

1. An integrated circuit system including:
a substrate;
logic circuits that perform specific functions fabricated on the substrate;
at least one Differential Receiver with a pair of differential inputs for receiving a pair of differential signals representing an information bit fabricated on said substrate; and
a fault detection circuit operatively coupled to the differential inputs, said fault detection circuit, not including the differential receiver, monitoring signals on the differential inputs and outputting a Defect Observe signal if an open circuit, stuck-at fault or shorted signals condition occurs in one or both of the differential inputs.

2. An integrated circuit chip including:
a substrate;
at least one Differential Receiver having an output, first and second differential inputs fabricated on said substrate;
a first and a second input differential signal lines, fabricated on said substrate, operatively coupled to the first and second differential inputs; and
a fault detection circuit, not including the at least one differential receiver, having an output and inputs directly coupled to the first and second input differential signal lines fabricated on said substrate wherein said fault detection circuit monitors signals on the first and second input differential signal lines and generating a Defect Observe error signal on an output of the fault detection circuit if an open circuit, stuck-at fault or shorted signals condition is detected on one or both of the first and second input differential signal lines.

3. The integrated circuit of claim 2 further including on chip logic circuits designed to provide particular functions, integrated on said substrate, operatively coupled to the at least one Differential Receiver and said fault detection circuit.

4. An integrated circuit chip including:
a substrate;
at least one Differential Receiver having an output, first and second differential inputs fabricated on said substrate;
a first and a second input differential signal lines, fabricated on said substrate, operatively coupled to the first and second differential inputs; and
a fault detection circuit, not including the at least one differential receiver, having an output and inputs directly coupled to the first and second input differential signal lines fabricated on said substrate wherein said fault detection circuit monitors signals on the first and second input differential signal lines and generating a Defect Observe error signal on an output of the fault detection circuit if an open circuit, stuck-at fault or shorted signals condition is detected on one or both of the first and second input; differential signal lines wherein sad fault detection circuit further includes a first Pull device operatively coupled to one of the differential inputs;
a second Pull device operatively coupled to another of the differential inputs;
a first Pass Gate operatively coupled to the first Pull device;
a second Pass Gate operatively coupled to the second Pull device; and
an XNOR circuit having inputs operatively coupled to the first Pass Gate and the second Pass Gate and an output whereat a signal from said XNOR circuit is available.

5. The integrated circuit of claim 4 further including a first FET device operatively coupled between the first Pass Gate and one of the inputs XNOR circuit and a second FET device operatively coupled between the second Pass Gate and another one of the inputs to said XNOR circuit.

6. The integrated circuit of claim 5 further including a first ESD resistor connecting one of the inputs of the differential pair signal lines to the first Pass Gate; and a second ESD resistor connecting another one of the inputs of the differential pair signal lines to the second Pass Gate.

7. The integrated circuit of claim 5 further including a first conductor, to receive and transmit a first control signal, coupled to the first Pull device and the second Pull device, said first control signal periodically inhibiting current flow through components on said integrated circuit.

8. The integrated circuit of claim 7 further including a second conductor, to receive and transmit a second control signal coupled to the first Pass Gate and the second Pass Gate, said second control signal deactivating the fault detection circuit if the integrated circuit chip is operating in a non-test mode.

9. The integrated circuit of claim 8 further including an inverter circuit having an output coupled to the first FET device and the second FET device and an input coupled to the second conductor.

10. The integrated circuit of claim 4 wherein the XNOR circuit includes a plurality of stages operatively coupled with each stage including a plurality of P and N-Channel devices operatively coupled and being supplied from a first voltage source; and an output stage formed from P and N-channel devices operatively coupled and being supplied from a second voltage source.

11. The integrated circuit of claim 10 wherein the first voltage source and the second voltage source have different values.

12. The integrated circuit of claim 10 wherein the first voltage source includes 1.5 V and the second voltage source includes 3.5 V.

* * * * *